(12) United States Patent
Spuhler et al.

(10) Patent No.: US 7,501,832 B2
(45) Date of Patent: Mar. 10, 2009

(54) METHOD AND CIRCUIT FOR THE DETECTION OF SOLDER-JOINT FAILURES IN A DIGITAL ELECTRONIC PACKAGE

(75) Inventors: Philipp S. Spuhler, Brookline, MA (US); Bert M. Vermeire, Mesa, AZ (US); James P. Hofmeister, Tucson, AZ (US)

(73) Assignee: Ridgetop Group, Inc., Tucson, AZ (US)

( * ) Notice: Subject to any disclaimer, the term of this patent is extended or adjusted under 35 U.S.C. 154(b) by 566 days.

(21) Appl. No.: 11/325,076

(22) Filed: Jan. 4, 2006

(65) Prior Publication Data

US 2006/0194353 A1    Aug. 31, 2006

Related U.S. Application Data

(60) Provisional application No. 60/657,101, filed on Feb. 28, 2005.

(51) Int. Cl.
*G01R 31/02* (2006.01)
(52) U.S. Cl. ............ 324/537; 324/765; 324/158.1
(58) Field of Classification Search ............ 324/537, 324/527, 765, 158.1
See application file for complete search history.

(56) References Cited

U.S. PATENT DOCUMENTS

| | | | |
|---|---|---|---|
| 6,097,203 A | 8/2000 | Parker | |
| 6,452,502 B1 | 9/2002 | Dishong | 340/653 |
| 6,489,537 B1 | 10/2002 | Akram | 324/765 |
| 6,564,986 B1 | 5/2003 | Hsieh | 228/103 |
| 6,568,581 B2 | 5/2003 | Boller | 228/103 |
| 6,788,092 B2 | 9/2004 | Cheng | |
| 6,847,900 B2 | 1/2005 | Ragland | |
| 6,894,524 B1 | 5/2005 | Grilletto | |
| 6,895,353 B2 | 5/2005 | Barr | |
| 6,906,541 B2 | 6/2005 | Kimura | |
| 6,927,589 B2 | 8/2005 | Wark | |
| 6,940,288 B2 | 9/2005 | Barr | |
| 6,978,214 B2 | 12/2005 | Budell | |
| 7,196,294 B2 | 3/2007 | Hofmeister | |

FOREIGN PATENT DOCUMENTS

WO   PCT/US2006/005335    2/2006

OTHER PUBLICATIONS

Daisy Chain Samples, AMD Application Note #24571, Oct. 25, 2001, pp. 1-3.

Ranjit Gannamani et al. Reliability Evaluation of Chip Scale Packages, AMD, pp. 4-10, 2001.

(Continued)

*Primary Examiner*—Vincent Q Nguyen
(74) *Attorney, Agent, or Firm*—Eric A. Gifford

(57) ABSTRACT

The solder-joint integrity of digital electronic packages, such as FPGAs or microcontrollers that have internally connected input/output buffers, is evaluated by applying a time-varying voltage through one or more solder-joint networks to charge a charge-storage component. Each network includes an I/O buffer on the die in the package and a solder-joint connection, typically one or more such connections inside the package and between the package and a board. The time constant for charging the component is proportional to the resistance of the solder-joint network, hence the voltage across the charge-storage component is a measurement of the integrity of the solder-joint network.

17 Claims, 8 Drawing Sheets

OTHER PUBLICATIONS

James Chan, Four-Point Probe Manual, University of California, Berkely EECS 143, 1994.

Roger Rorgren et al., Reliability of BGA Packages in an Automotive Environment, Proc. Surface Mount International, San Jose, 1997.

Solder Joint Monitoring System, 04013-13013, Symtx Corp. www.symtx.com, downloaded Dec. 12, 2005.

MK Test Systems AutoMeg Product Range, MK Test Systems, www.mktest.com, downloaded Dec. 19, 2005.

EP Search Report Nov. 21, 2006, Ridgetop Group.

METHOD AND CIRCUIT FOR THE DETECTION OF SOLDER-JOINT FAILURES IN A DIGITAL ELECTRONIC PACKAGE

CROSS-REFERENCE TO RELATED APPLICATIONS

This application claims benefit of priority under 35 U.S.C. 119(e) to U.S. Provisional Application No. 60/657,101 entitled "Non-Invasive Real Time Method for the Detection of Solder Joint Failures" filed on Feb. 28, 2005, the entire contents of which are incorporated by reference.

GOVERNMENTAL RIGHTS

This invention was made with Government support under Contract N68335-05-C-0101 awarded by Naval Air Warfare Center AD (LKE). The Government has certain rights in this invention.

BACKGROUND OF THE INVENTION

1. Field of the Invention

This invention relates to a method and circuit for detection of solder joint failures in digital electronic packages such as Field Programmable Gate Arrays (FPGAs) and Microcontrollers and between the packages's ball grid array (BGA) and printed wire board (PWB).

2. Description of the Related Art

Solder-joint connections from digital electronic packages such as FPGAs or Microcontrollers to Printed Wire Boards (PWB) are a major reliability problem. Modern Ball Grid Array (BGA) packages have several thousand pins and the number of pins on these packages is likely to increase over the next several years. The increased number of pins on the packages is necessary to support the evolving complexity of circuits; however, one of the drawbacks of the increase is reduced reliability. For many applications it would be useful to detect failures or precursors to failures in the solder-joint connections from inside the digital logic on the die, through the multiple internal interconnects inside the package and through the external interconnects to circuitry on the PWB; together the "solder joint network".

Failure mechanisms include manufacturing defects and operation of the electronic package. Manufacturing defects may include variance in the materials, variance in the manufacturing process or assembly of one specific package. These types of defects will produce a high probability of failure early in the expected life cycle of a part. Operation of the package subjects solder joints to physical stress/strain, thermal stress/strain, voltage stresses, shock, vibration and electro-migration. These stresses will typically produce random failures at a fairly low rate during the useful life of the period; then near the end of the expected life cycle the failure rate will increase due to accumulated fatigue of the solder joints.

As shown in FIG. 1a, an exemplary FPGA 10 includes at least one flip-chip 12 consisting of a die mount 18 and die 16 mounted inside a cavity 14 of a BGA package 22. Electrical components such as transistors, diodes and capacitors that are configured via wire interconnects on a die 16 together constitute the FPGA. The FPGA includes write logic that is connected through an output buffer to a pad on the die. Similarly an input buffer is connected from a pad to read logic. The buffers may be either inverting or non-inverting. Flip-chip 12 is placed inside BGA package 22 so that the solder balls 20 (also called solder bumps) inside the BGA package 22 touch pads, lands or vias of flip-chip 12 and they are soldered to form solder-joint connections. Vias lead from contacts (not shown) of solder bumps 20 to an outside ball limiting metallurgy (BLM) 24 and primary BGA solder balls 26 to complete the FPGA 10. In FIG. 1b, some manufacturing processes result in an intervening connection between die connection 40 and a flip-chip connection 42, and sometimes die connection 40 and flip-chip connection 42 are one and the same: a single connection. The FPGA is placed so that primary BGA solder balls 26 contact solder paste on metal LANDs 28 on a PWB 30. The assembled PWB is heated and the solder balls 26 melt and reflow to attach themselves to the metal LAND. The PWB is configured so that the metal LANDs are connected by vias and/or wiring 32 to one or more I/O nodes 34 for external circuitry on the PWB.

As shown in FIGS. 1b and 1c, a "solder joint network" 36 that connects the output of the write logic (or the input of read logic) on die 16 to node 34 on the PWB consists of considerably more than just the primary BGA 26 between the package and the PWB. As shown in FIG. 1b, a simplified mechanical representation of the network includes buffer connection 38, die connection 40 (first BGA, pads, vias . . . ), flip-chip connection 42 (second BGA, pads, vias . . . ), package connection 44 (primary BGA, BLM, pads, vias . . . ) and the PWB connection 46. As shown in FIG. 1c, the electrical representation of the network includes resistances for the connections (buffer, die, flip chip, package and PWB) and the interconnections 47a-47d between connection nodes for each of the mechanical components. There is a contact resistance on each side of a solder-ball connection plus a connection resistance called a contact resistance. The specific resistances are as follows:

R38LC=left-side contact resistance of solder ball 38
R38=resistance of solder ball 38
R38RC=right-side contact resistance of solder ball 38
R38_40=resistance of interconnection between contacts of solder balls 38 and 40
R40LC=left-side contact resistance of solder ball 40
R40=resistance of solder ball 40
R40RC=right-side contact resistance of solder ball 40
R40_42=resistance of interconnection between contacts of solder balls 40 and 42
R42LC=left-side contact resistance of solder ball 42
R42=resistance of solder ball 42
R42RC=right-side contact resistance of solder ball 42
R42_44=resistance of interconnection between contacts of solder balls 42 and 44
R44LC=left-side contact resistance of solder ball 44
R44=resistance of solder ball 44
R44RC=right-side contact resistance of solder ball 44
R44_46=resistance of interconnection between contacts of solder balls 44 and 46
R46LC=left-side contact resistance of solder ball 46
R46=resistance of solder ball 46
R446C=right-side contact resistance of solder ball 46

The secondary connections in FIG. 1c are shown as small solder balls, but might be comprised of a combination of solder balls, wire bonds and integrated circuit vias and pads. If each connection and interconnection in the network is sound, each resistance will be low and the total network resistance will be low.

The manufacturing defects and operational failure mechanisms will typically manifest as voids, cracks or corrosion in the solder balls 26, cracks, corrosion or diffusion in the ball limiting metal (BLM) 24 between each ball and the package or migration between the balls 26. Although failures typically occur at the interface of a BLM and its attached ball or at the interface of a PWB LAND and its attached ball, the same failure mechanisms might cause solder joint failures within the package itself at any of the connections. Any such failure will result in a defective electronic package.

Many studies have been conducted to determine the reliability of BGA packages. They conclude that solder-joint networks fail intermittently and as hard failures. An intermittent failure manifests itself during thermal or mechanical transients or disturbances in the form of short-duration high-resistance spikes. The second type of solder-joint failure is a hard failure, which manifests itself as a steady-state high-impedance, including an open of infinite impedance. Intermittent failures typically precede hard failures; they therefore represent the most relevant breakdown mechanism for solder joint failures. The tests also indicate that, prior to hard failure of the BGA package, one or more solder joints exhibit changes in resistance on the order of hundreds of milliohms and ohms, which do not result in a hard failure.

To evaluate the failure mechanisms that affect solder bump reliability and to evaluate the efficacy of manufacturing materials and processes, sample devices are subjected to a number of tests including moisture resistance test, bump shear/pull test, temperature cycle life test and high temperature operation and storage tests. These tests can be used to evaluate a particular design; what is the expected useful life, what are the likely failures, etc. or to gain data to improve upon the design. The tests can also be used to evaluate a batch of devices for manufacturing defects. If a number of devices fail initially or early on then there may be something wrong with the materials or process control. None of these tests are suitable for testing actual fielded devices during operation.

The effects of these tests on the solder joints can be evaluated using a variety of techniques. Methods of analyzing the solder joints without opening the package include radiography, ultrasonic examination and hermetic evaluation. Alternately, the package can be opened, cut or shaved to expose to the solder joints for visual or other inspection. Finally, as shown in FIG. 2, the integrity of the solder joint can be evaluated by measuring the bump connection resistance of a BGA package 50 flip-chip mounted to a PWB 52 during the test and judging defects by the degree of change in the connection resistance.

As shown in FIG. 2, wire segments 54 connect vias 56 inside the package and PWB wiring 58 connects pads 60 on the PWB to connect solder bumps 62 attached to ball-limiting metallurgy 66 from the primary BGA in a "daisy chain". A meter 64 directly measures the resistance for all bumps 62 at the same time by either applying a voltage and measuring a current or vice-versa. Alternately, the wire segments and PWB can be configured to measure the resistance between two bumps 62 at a time, so increases in resistance due to cracking can be monitored.

The techniques for direct measurement of the solder-joint resistance have a number of limitations. The BGA package and PWB are 'blanks' or 'dummies' configured for the 4-wire or continuous measurements, and therefore they are not the same as the operational devices. Specifically, the package does not include the FPGA flip-chip containing the operational logic gates and buffers: Digital logic gates within the solder joint network prevent the direct measurement of the network resistance because those logical devices and buffers present an open circuit (infinite impedance) to series direct measurement techniques. It follows that these tests cannot be performed on actual operational devices, either in the lab or particularly in the field. Finally, there are several instruments available to perform these measurements, however, besides being bulky and suitable for lab testing, these instruments cannot be used to perform real-time, in-use testing of fielded, operational FPGA BCA solder joint networks.

The current test procedures for measuring the resistance may be adequate for evaluating the condition of the solder joints formed by the primary BGA during or after the various stress tests to evaluate the design or potential manufacturing defects, but they are not applicable to actual operational devices, particularly for ongoing testing during the normal operation of a fielded device. Furthermore, these tests are not capable of evaluating the internal solder-joint connections of the FPGA BGA package or the flip-chip prior to subsequent assembly and fielding of the device. There remains a need for a capability to measure the resistance of the solder-joint network for screening devices during different stages of assembly and particularly during normal operation of the fielded device.

SUMMARY OF THE INVENTION

The following is a summary of the invention in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description and the defining claims that are presented later.

The present invention provides a method for evaluating solder-joint integrity of digital electronic packages, such as FPGAs or microcontrollers, that have internally connected input/output buffers, and particularly for evaluating the integrity of the solder-joint network during normal operation of the digital electronic packages. The invention is particularly applicable to high density ball grid array (BGA) packages.

This is accomplished by applying a time-varying voltage through one or more solder-joint networks to charge a charge-storage component. Each network includes at least one I/O buffer on the die in the package and a solder-joint connection, typically one or more such connections inside the package and between the package and a board. The time constant for charging the component is proportional to the resistance of the solder-joint network; hence the voltage across the charge-storage component is a measurement of the integrity of the solder-joint network. In different embodiments the time-varying voltage may be generated on- or off-chip and measured on- or off-chip.

In a first exemplary embodiment, a digital electronic package, which includes a die mounted within a Ball Grid Array (BGA) package, is soldered to a printed wire board (PWB). Write logic on the die is configured to apply a time-varying voltage through a first solder-joint network including an output buffer, any internal solder-joint connections and an external solder-joint connection between the package and PWB to charge a charge-storage component coupled thereto. Read logic on the die measures a voltage caused by the charging of the charge-storage component through a second solder-joint network including an input buffer, any internal solder-joint connections and an external solder-joint connection, as a measure of the resistance of the first solder-joint network, hence the integrity of the first solder-joint network.

In a second exemplary embodiment, a digital electronic package, which includes a die mounted within a BGA package, is soldered to a printed wire board (PWB). Write logic external to the package is configured to apply a time-varying voltage through a solder-joint network including a first external solder-joint connection between the PWB and package, any internal solder-joint connections, an input buffer, an output buffer, any internal solder-joint connections and a second external solder-joint connection between the package and PWB to charge a charge-storage component coupled thereto. Read logic external to the package measures a voltage caused by the charging of the charge-storage component as measure of the resistance of the solder-joint network, hence the integrity of the solder-joint network.

These and other features as well as advantages of the invention will be apparent to those skilled in the art from the following detailed description of preferred embodiments, taken together with the accompanying drawings, in which:

DETAILED DESCRIPTION OF THE INVENTION

The present invention provides a method for evaluating solder-joint integrity of operational digital electronic packages, such as FPGAs or Microcontrollers that have internally connected input/output (I/O) buffers and high density ball grid array packages, and particularly for evaluating the integrity of the solder-joint network during normal operation of the digital electronic packages. The invention will be described for a FPGA including a flip-chip mounted in a BGA package that is reflow soldered to a PWB, but it will be understood that the method and circuit for evaluating solder-joint integrity is generally applicable to any digital electronic package that has internally connected input/output buffers in the solder-joint network regardless of whether the die is configured as an FPGA, microcontroller or otherwise, or whether a specific mount method, such as a flip-chip is used, or whether a specific bonding method, such as wire bonding is used, or regardless of a specific BGA package type such as BGA or a Fine-pitch BGA, or whether a socket is used prior to assembly on the PWB.

Figure 1A:
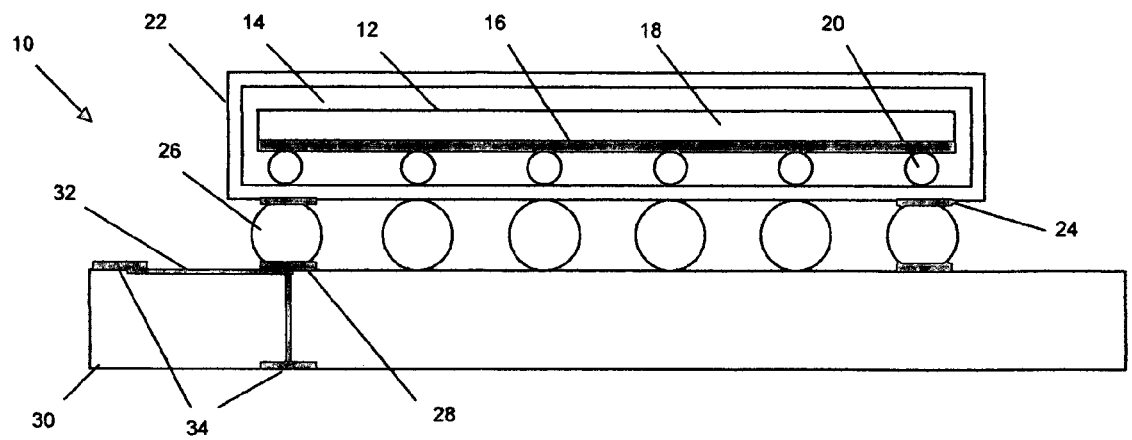
FIGS. 1a-1c, as described above, are diagrams illustrating the solder-joint network in a typical digital electronic package and the physical connection and distributed electrical resistance representations of the solder-joint network.
Figure 1B:
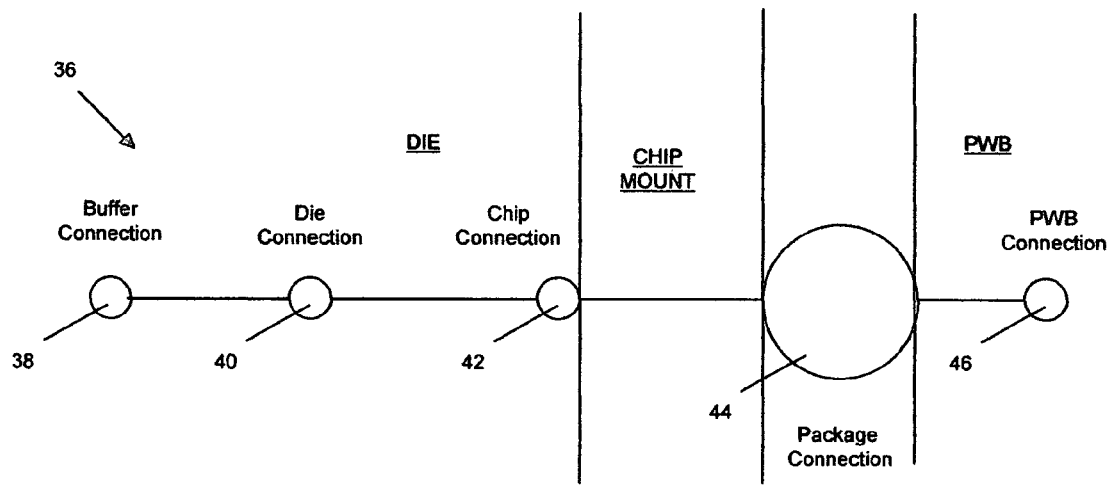
Figure 1C:
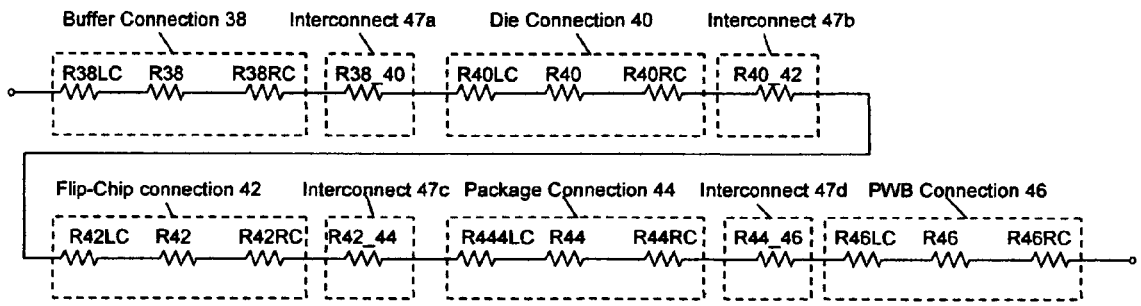
Figure 2:
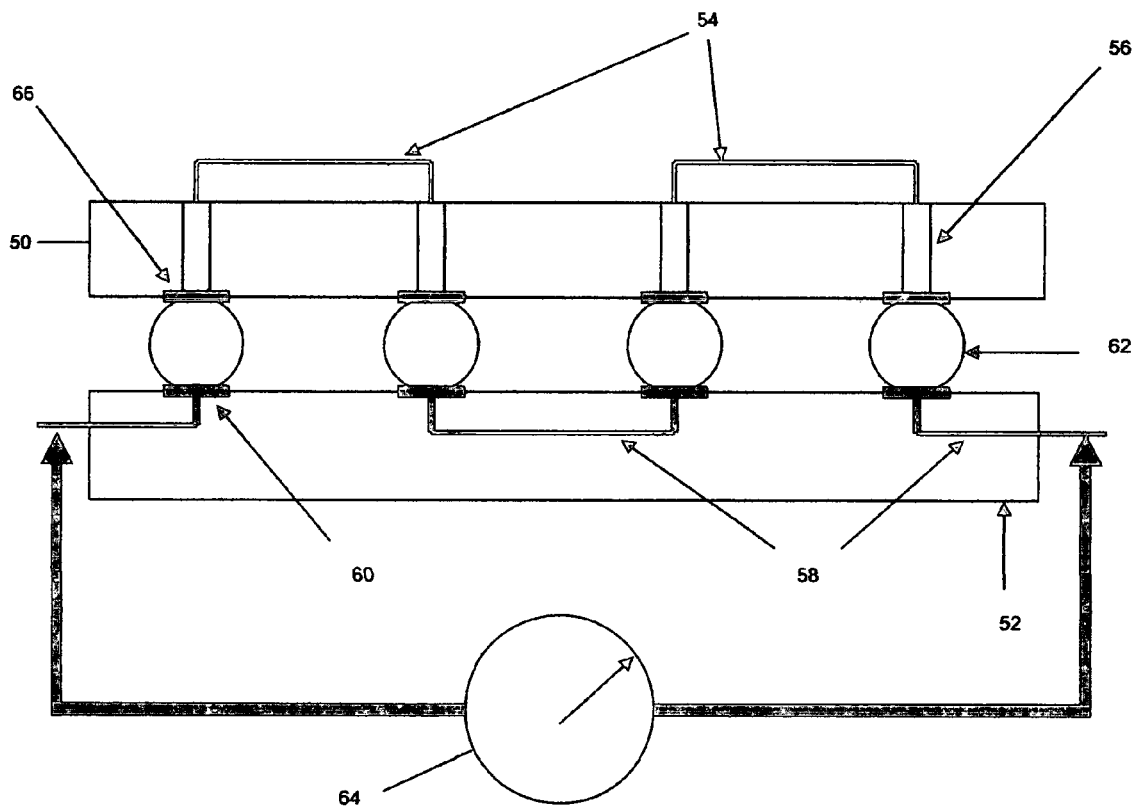
FIG. 2, as described above, is a diagram of a conventional direct resistance measurement to evaluate the integrity of the solder joints formed between the primary BGA of a blank BGA package and the PWB.
Figure 3:
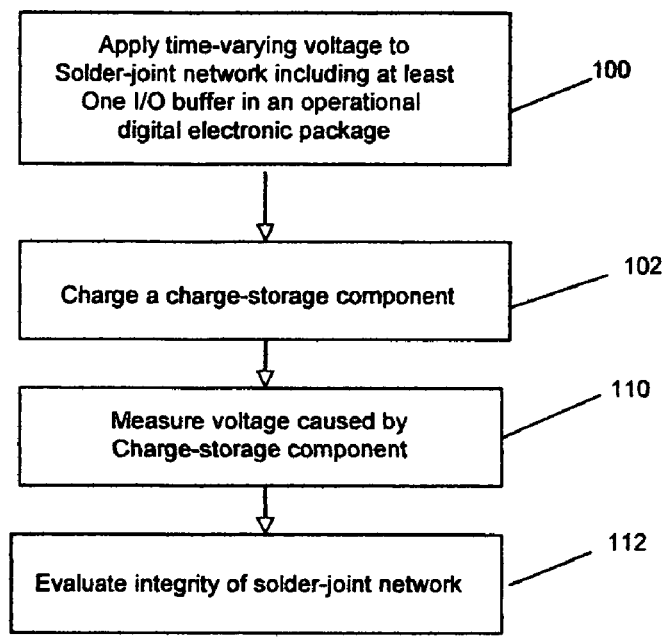
FIG. 3 is a flow diagram for the indirect measurement of the resistance of the solder-joint network in an operational digital electronic package.
Figure 4:
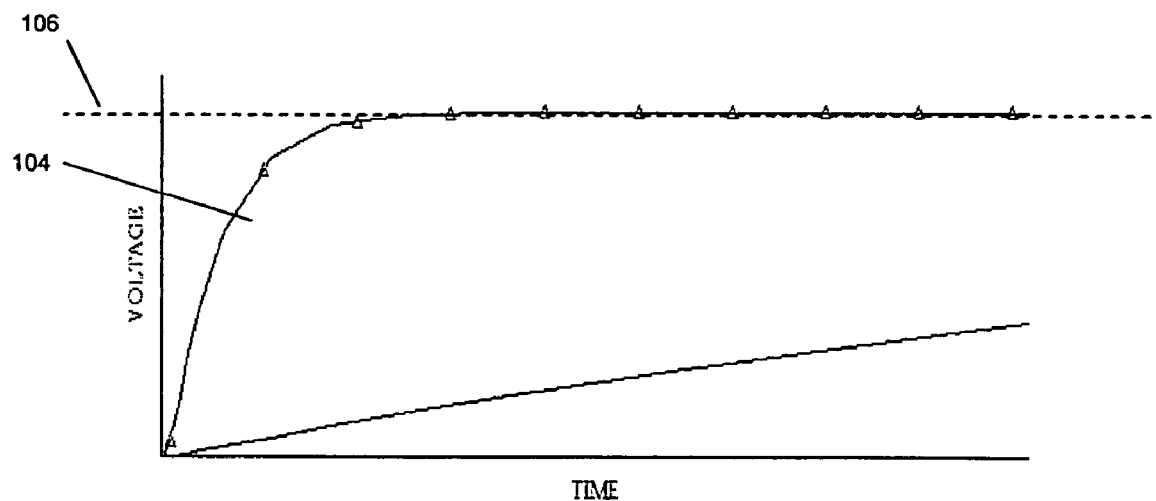
FIG. 4 is a voltage plot illustrating the charging of a charge-storage component for good and bad solder-joint networks.

As illustrated in FIGS. 3 and 4, a time-varying voltage is applied to and through a solder-joint network that includes at least one logic gate on a die inside the FPGA's BGA package and at least one solder-joint connection (step 100). Typically, the network will include an I/O buffer, multiple internal solder-joint connections including the "buffer connection", "die connection" and "flip-chip" connections, and the external "package connection" formed between the BGA package and PWB. In certain configurations, multiple networks will be evaluated at once. The time-varying voltage is suitably a pulse of the type in digital logic circuits but could be a ramp, saw tooth or other variable voltage.

The time-varying voltage charges a charge-storage component that terminates the network (step 102). The charge-storage component is preferably a capacitor but could be an RC circuit, an inductor, LC, RLC or a memory cell and can be positioned either inside or outside of the package under test. In a microcontroller, analog components such as a capacitor are available and could be connected internally through MCU programming. Alternately, a special purpose FPGA including internal capacitors could be designed. The time constant for charging the component is proportional to the resistance of the solder-joint network. If each of the solder-joint connections in the network is good, the resistance will be low and a component voltage 104 will charge to a voltage level 106 relatively quickly. However, if any of the solder-joint connections are defective, ranging from complete failure to various stages of degradation, the resistance will be higher and a component voltage 108 will charge up to the voltage level more slowly.

The component voltage is measured (step 110) and used to evaluate the integrity of the solder-joint network (step 112). The voltage can be measured across the component, at a different point in the test circuit or by inductively coupling the voltage to a measurement device. The voltage is typically measured at a time relative to the application of the time-varying voltage that would allow a good network to charge the component at or close to the voltage level but would inhibit a defective or degraded network from charging the component substantially. For example, if the time-varying voltage is applied as pulses, the component voltage may be read out near the falling edge of the pulse. The measured voltage can be either analog or digital (binary or multilevel).

Because the measured voltage is proportional to the network resistance, the voltage provides a measure, albeit indirect, of the resistance. The presence of logic gates in the network prevents a direct resistance measurement. As described earlier, the network resistance is an indicator of the health and integrity of the network. This information can be used in a deterministic, prognostic or diagnostic manner. For example, if the measured voltage is low, the resistance is high, and the network and the associated solder-joint network (or "pin") will be determined to have failed. As will be discussed below, if a test pin is determined to fail, the FPGA can be declared to fail or it can be used to predict the remaining useful life of the FPGA. Alternately, the low voltage and the number of occurrences of low voltage may be used to predict when the pin, hence FPGA, will fail. The resistance levels or failure modes of one or more test pins may provide some diagnostic information as well.

This approach has particular value for FPGAs (or other packaged devices) that are soldered to the PWB and in the field and operational as part of a larger system. For example, let us assume the FPGA is a critical component of the guidance system for a missile. Clearly it would be undesirable to launch a missile or launch an aircraft with a missile that has a solder-joint connection failure or a substantial risk of such a failure that could affect the guidance capability. The described test procedure could be initiated automatically, say on-power up of the guidance system, or by a crewman prior to loading or launching the missile to verify solder-joint integrity. Now the FPGA would not ordinarily be configured to test every pin but would typically be configured to test those pins that are the most likely to fail. Therefore degradation or failure of any of these pins is a good predictor that the operational pins may fail. The capability to test the entire solder-joint network in an operational and fielded device is critical for many military applications and highly desirable for consumer applications, and is a capability that is not supported by known test procedures, namely the direct resistance measurement. The relevant question for the end user is whether the fielded and operating device is reliable, not whether the materials and manufacturing processes used to make the package are statistically reliable.

Figure 8:
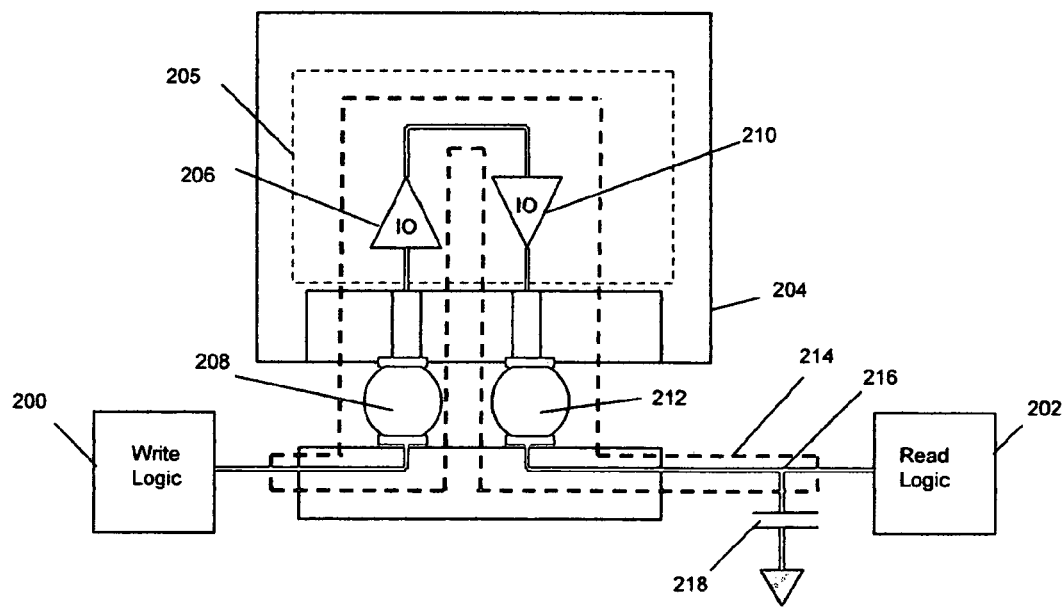
FIG. 8 is a schematic diagram of an embodiment in which the write and read logic that constitute the test circuit are provided off-chip outside the package.

The described method of evaluating the solder-joint network can be implemented in the FPGA and a test circuit in a number of different configurations. The circuitry for applying ("write") the time-varying voltage and measuring ("read") of the component voltage can be configured in the FPGA (FIG. 5) or external to the FPGA under test (FIG. 8). Alternately, the voltage could be written on the die and read externally or vice-versa. For purposes of clarity and illustration, the internal chip mount and solder-joint connections are not shown but it is understood that those connections are part of the network and can be provided in many different configurations. Furthermore, only a few representative solder ball joints are depicted. It is understood that typical devices will have hundreds to thousands of solder balls connected through I/O buffers to write and read logic that implement the FPGA.

Figure 5:
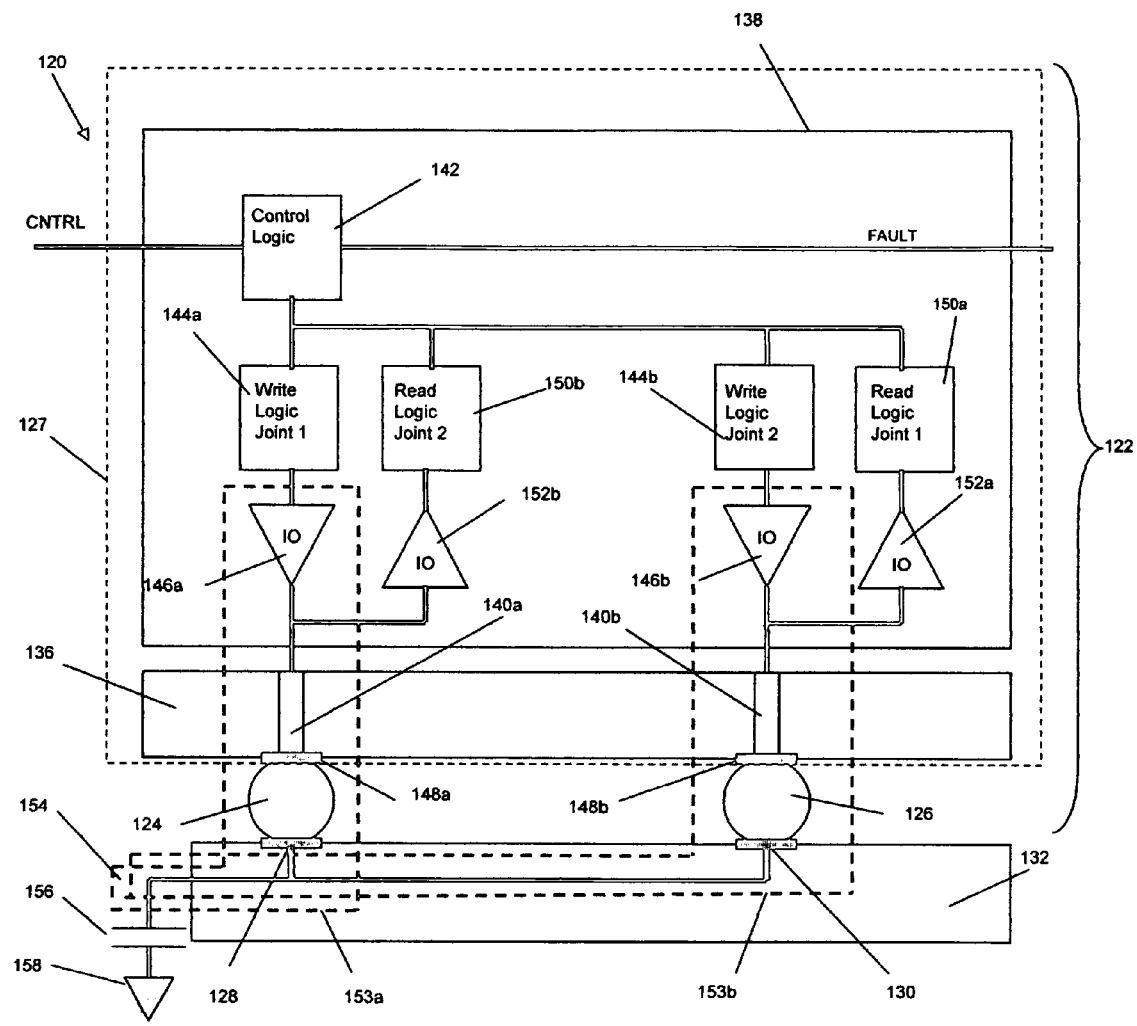
FIG. 5 is a schematic diagram of an embodiment in which the write and read logic that constitute the test circuit are provided on the die inside the package.

As shown in FIG. 5, a FPGA assembly 120 configured for solder-joint network testing includes an FPGA 122 having solder balls 124 and 126 positioned underneath a BGA package 127 and reflow solder to LANDS 128 and 130, respectively, on a printed wire board (PWB) 132. A flip-chip 136 with an FPGA die 138 is mounted in package 127 in electrical communication with vias 140a and 140b. In a typical FPGA the die is configured to provide read/write capability at each of the output pins (solder balls). The die includes write logic 144a, 144b that is configured to write a voltage pulse to and through an output buffer 146a, 146b, through the internal solder-joint connections (not shown), vias 140a, 140b, Ball-Limiting Metallurgical contacts 148a, 148b and solder balls 124,126. Die 138 also includes read logic 150a, 150b that is configured to read a voltage at solder balls 126, 124 through input buffer 152a, 152b as a digital, typically binary, value. The sequencing of writes and reads, beginning and ending of tests, and recording and sending of fault information is controlled by Control Logic 142.

To implement the invention and evaluate the integrity of the solder-joint network 153a (Joint 1) or 153b (Joint 2) between the write logic 144a or 144b and a node 154, a capacitor 156 is connected between node 154 and ground potential 158 to terminate both networks. The write logic is configured to write a voltage pulse in response to a CNTRL signal, which can be generated on-chip or off-chip, to charge the capacitor. The read logic is configured to read the voltage across the capacitor at an appropriate delay with respect to the write pulse, evaluate the measured voltage, e.g. compare it to the write pulse, and, if appropriate, declare a fault. In this configuration, the voltage pulse is written through one pin (solder ball 124) and read through the other pin (solder ball 126) to measure the resistance of the written network Joint 1 153a. The test can be repeated in the opposite direction to test Joint 2 153b.

Figure 6:
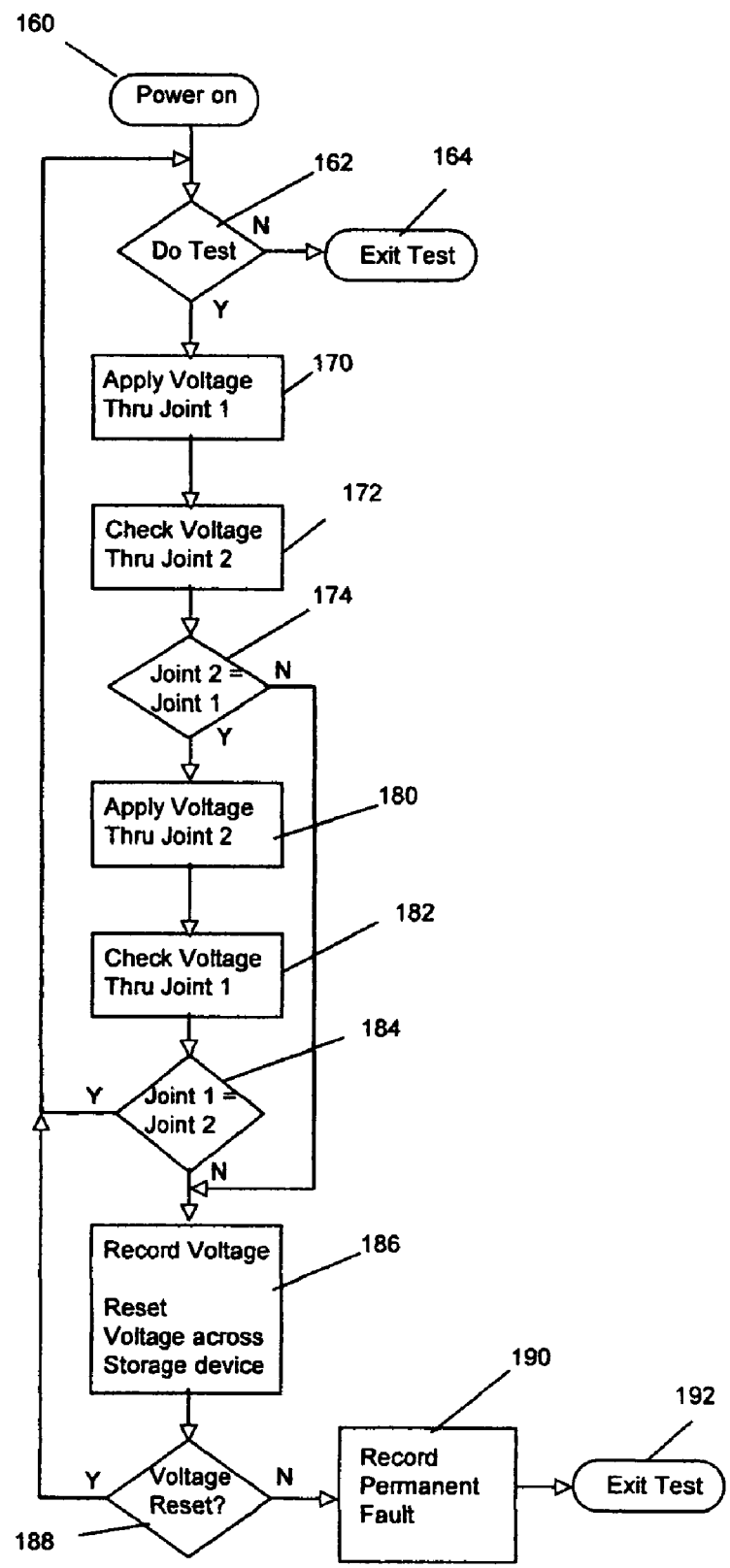
FIG. 6 is a flow diagram of an embodiment for writing a test voltage through a solder-joint network and reading a voltage caused by charging the charge-storage component to determine a fault.
Figure 7:
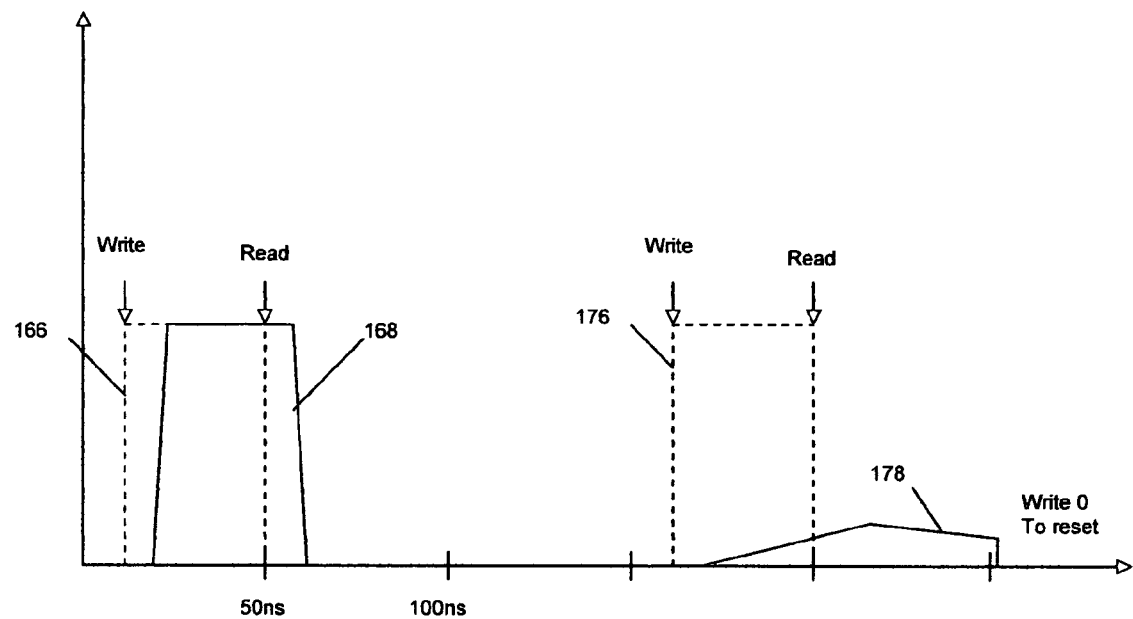
FIG. 7 is a voltage plot illustrating the charging and discharging of the charge-storage component for different network resistances.

An exemplary test procedure for the FPGA 122 is illustrated in FIGS. 6 and 7. The FPGA is powered on (step 160) and a determination is made whether to execute the test (step 162). This determination could be done automatically on every power on or some other criteria or could be based on an external command signal. If no, the test exits (step 164). Otherwise write logic 144a generates a voltage pulse 166 off the internal clock signal and applies it through Joint 1 to charge a voltage 168 on the capacitor 156 (step 170). Read logic 150b measures voltage 168 through Joint 2 off the same clock signal at some prescribed delay, which is determined by the amount of capacitance, expected network resistance and applied voltage pulse (step 172). Once the voltage pulse is removed, the capacitor will discharge.

Input buffer 152a is suitably configured so that if the network resistance is low (good) the voltage will have charged sufficiently to exceed the buffer's high-on trigger point and drive the buffer high. Conversely, if the network resistance is high (bad), the voltage will be less than the buffer's low-off trigger point and drive the buffer 152a low. The read logic checks to see whether the applied voltage (high) and the measured voltage are equal, e.g. same logic state (step 174). If not, the algorithm skips forward to step 186 to record the fault.

In this example, Joint 1 passes so the process is repeated to test Joint 2, which for this example is bad (high resistance). Write logic 144b generates a voltage pulse 176 off the internal clock signal and applies it through Joint 2 153b to charge a voltage 178 on the capacitor (step 180). Read logic 150b measures voltage 178 through Joint 1 (step 182) and determines whether the applied and measured logic states are equal (step 184). The inequality of the applied voltage 176 and measured voltage 178 means that the resistance of Joint 2 is high, hence defective. The read logic records a fault and writes a "0" through a different pin, e.g. pin 1, to force a hard reset of the capacitor voltage (step 186). The hard reset is needed because of the long time-constant for discharging the capacitor through a defective network. If the voltage fails to reset (step 188) than at least a second pin has failed and a permanent fault is recorded (step 190) and the test is exited (step 192). Otherwise the test can be repeated over a period of time for the same pair of pins to determine whether a failure happened only once, repeats sporadically, is a hard failure, etc. or conducted for different pairs of pins. It is understood that the test procedure shown in FIG. 6 is only exemplary and that many other sequences of steps can be envisioned to test the solder-joint networks in digital electronic packages.

As shown in FIG. 8, the write logic 200 and read logic 202 (not necessarily integrated or discrete logic circuits) can be provided external to the BGA package 204. The FPGA die 205 is configured to connect an input buffer 206 for a first solder ball 208 to an output buffer 210 for a second solder ball 212 to define a solder-joint network 214 between the write logic and an external node 216 that includes a first solder-joint network (SJN1) between the write logic and the output of input buffer 206 and a second solder-joint network (SJN2) between the input to output buffer 210 and node 216. A capacitor 218 is connected between the node and ground potential to terminate the network.

Write logic 200 generates a voltage pulse that is applied to SJN1. Assuming that SJN1 is good, the output of buffers 206 and then 210 will switch to a logic state high. This high voltage is then applied, much like as described in FIG. 5, to and through SJN2 to charge capacitor 218. Read logic 202 measures the voltage and determines whether there is a failure within SJN2. If SJN1 is defective the read logic may or may not detect a failure. For example, if there is a "hard open" in SJN1, the input buffer will remain low and a low voltage will be applied to the capacitor, in which case the read logic will determine a failure, although it will not know whether the failure occurred in SJN1 or SJN2. However, if the resistance of SJN1 is merely high the applied voltage pulse may or may not switch the input buffer high. If the resistance combined with any parasitic capacitance (SJNQ does not see the capacitor) causes the voltage seen by the input buffer to charge slowly, the buffer may not switch high in time to charge the capacitor before the read cycle, and thus a fault will be declared. Conversely, if the parasitic capacitance is low the buffers will switch high quickly and the read logic will not detect the failure in SJN1.

Other configurations of the FPGA and test circuit are available to implement the invention. For example, the FPGA could be configured to write the voltage pulse through an output buffer and solder ball to charge the capacitor with the read logic being placed outside the package. Conversely, the write logic could be external to the package to drive the solder ball and capacitor to present a voltage to the input buffer and read logic in the FPGA.

Figure 9:
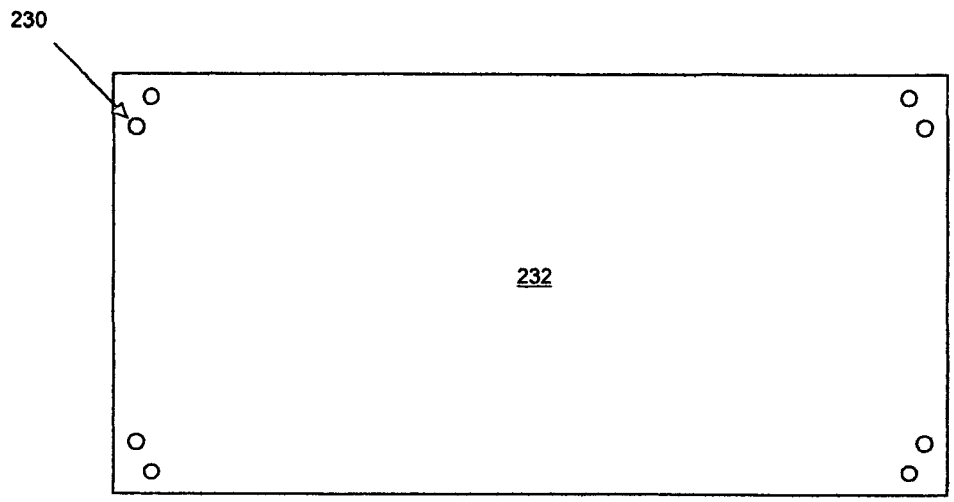
FIG. 9 is a plan view of a die illustrating a preferred location of the solder bumps to be tested.

As mentioned previously, the FPGA would not ordinarily be configured to test every pin (solder ball), to do so would consume excessive space on the die, be expensive and is unnecessary. In a typical FPGA a considerable number of the pins and portion of the available logic is not configured for the user application, as much as 40% or more. One approach would be to place test pins and the R/W logic throughout the FPGA. In this case, the test pins would see approximately the same mechanical, thermal and general operational stress as the operational pins and should fail at about the same time and at the same rate. Another approach, as shown in FIG. 9, is to place the test pins 230 on the FPGA 232 where they will experience the highest stress and thus have the highest probability of failing first. These test pins then act as "a canary in the mine", when one or more of the test pins fail it is a good indicator that operational pins will soon fail. Depending upon the application, the FPGA assembly and the FPGA mounted on it may be taken out of service immediately or scheduled for replacement prior to expected failure. In most applications, the greatest stress load will occur at one of the corners of the FPGA. Therefore, at least a couple test pins are positioned at each of the corners.

Figure 10:
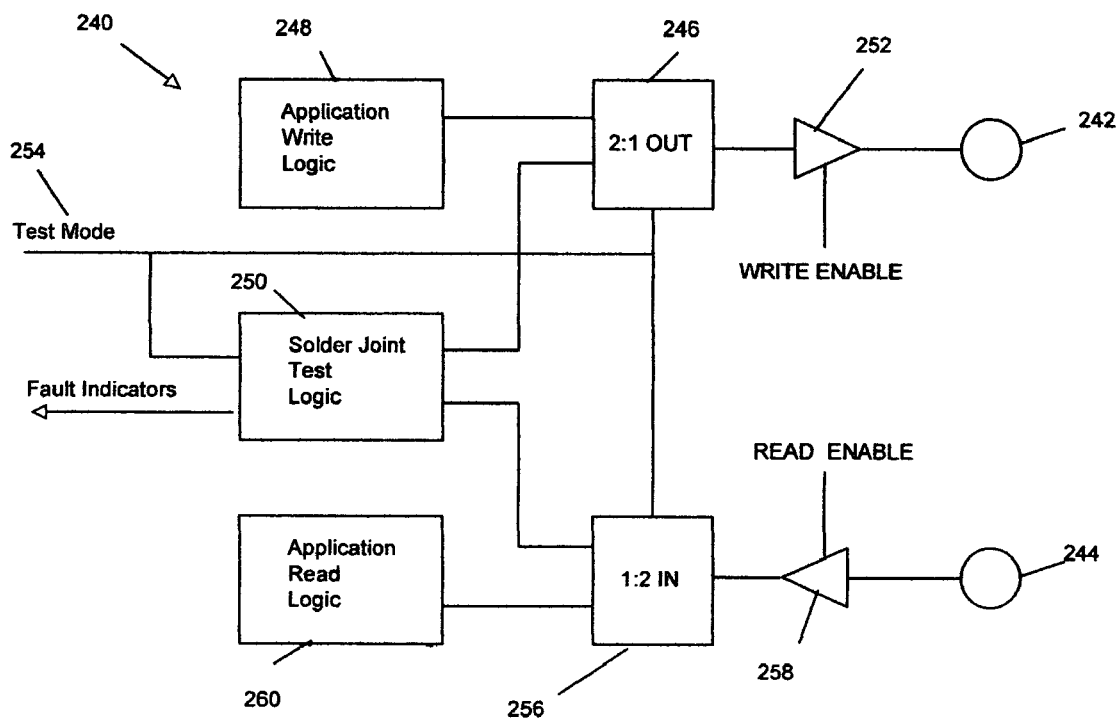
FIG. 10 is a diagram of the digital logic on the die illustrating that the test logic may be multiplexed with the operational logic to use the same solder-joint network for test and operational purposes.

Although typical FPGAs have many unused pins available for configuration as test pins, as shown in FIG. 10, an FPGA 240 may be configured so that a I/O pins 242 and 244 can support both the test and user applications. For simplicity, only the logic required to write one pin and read the other pin is shown. This is done by inserting a 2:1 Mux 246 between the application's write logic 248, the test logic 250 and the output buffer 252. If a test mode (TMODE) flag 254 is enabled the mux 246 passes the voltage pulse from the test logic 248 through the output buffer 252 to pin 242. Otherwise the mux passes the write pulses from the application write logic. Similarly, a 1:2 Mux 256 is positioned between the input buffer 258 and the application read logic 260 and test logic 250. If TMODE is enabled, the mux 256 passes the logic state at pin 244 from the input buffer to the test logic, otherwise it is routed to the application read logic.

Figure 11:
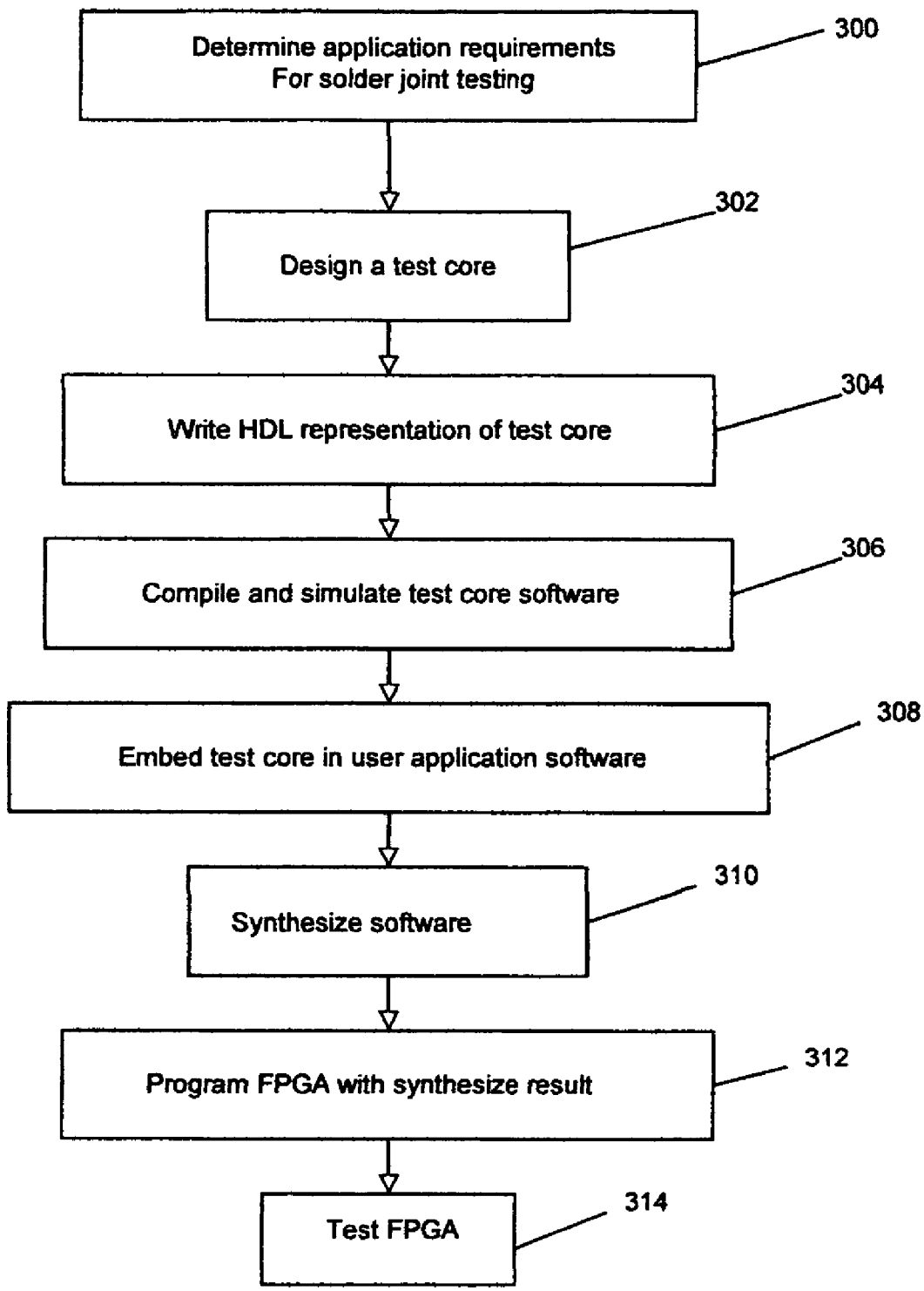
FIG. 11 is a flow diagram for embedding a test core in a user application to program an FPGA.

In a FPGA nothing is initially connected. To configure an FPGA for a particular user application and solder-joint test application, the connections between the transistor circuits, input and output ports, gates, flip-flops, switches, power, ground etc. must be fused closed or blown open to implement a particular design. An exemplary embodiment for programming an FPGA to include both a user application and the test circuit is shown in FIG. 11. The first step is to determine application requirements for solder-joint testing (step 300). These requirements may include the maximum and minimum number of pins to be monitored; location of those pins; the input clock frequency; the number of output fault signals; the fault-resolution (1 per FPGA, 1 per cluster of ports connected to each capacitor, 1 per port, 16 counts instead of 1 or may be 32 or 64 . . . nnnn); the mode selection—normal or test), etc. Next, a test core of, for example, the type shown in FIG. 5, is designed to monitor specified pins at the specified frequency to produce the specified fault signal(s) and count(s) when faults (detected loss of integrity of one or more solder-joint networks) per the specified selection mode (step 302). A Hardware Description Language (HDL) representation of the test core is written that maps the hardware design into a programming language (step 304). The HDL representation of the design is compiled and simulated as though it were an FPGA (step 306). Step 304 is repeated if any compile errors are detected. Steps 302 and 304 are repeated if any logic errors in the design are revealed by the simulation. At this point, the compiled test core software is embedded in user application software (step 308). Presumably the user application software was designed and debugged off-line. Thereafter, user application software (including the embedded test cores) is synthesized to produce an executable hardware program (step 310). The executable program is loaded into a hardware tool that programs the FPGA (step 312). The FPGA is tested (step 314) and steps are repeated as desired and necessary to satisfy the requirement that the FPGA works as desired and designed.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A method of testing the integrity of a solder-joint network for a digital electronic package, comprising:
    applying power to the digital electronic package;
    applying a time-varying voltage to a first end of and through a first solder-joint network including at least one solder-joint connection and at least one in-series powered-on I/O buffer on a die in the electronic package to charge a charge-storage component at a second end of the first solder-joint network; and
    measuring a voltage caused by the charging of the charge-storage component as a measure of the resistance of the first solder-joint network.

2. The method of claim 1, wherein said first solder-joint network includes at least one said solder-joint connection between the package and a printed wire board.

3. The method of claim 1, wherein said first solder-joint network includes at least one said solder-joint connection between the die and the package.

4. The method of claim 1, where said first solder-joint network includes at least one said solder-joint connection between the die and said I/O buffer.

5. The method of claim 1, wherein said at least one solder-joint connection comprises a solder ball joint.

6. The method of claim 1, wherein the charge-storage component comprises a capacitor.

7. The method of claim 1, wherein the time-varying voltage is applied as a binary pulse and measured as a binary voltage.

8. The method of claim 1, wherein application of the time-varying voltage is initiated upon application of power to the digital electronic package.

9. The method of claim 1, wherein a plurality of said first solder-joint networks are positioned near the corners of the digital electronic package.

10. The method of claim 1, wherein said at least one I/O buffer includes an output buffer, and wherein the time-varying voltage is applied by write logic on the die to and through the output buffer to said at least one solder-joint connection to charge the charge-storage device and the voltage caused by the charging of the charge-storage component is measured by read logic on the die through a second solder-joint network including a second solder-joint connection and an input buffer as a measure of the resistance of the first solder-joint network.

11. The method of claim 1, wherein said at least one I/O buffer includes an input buffer and an output buffer, and wherein the time-varying voltage is applied by write logic outside the package to and through a first solder-joint connection, in the input buffer, out the output buffer and through a second solder-joint connection to charge the charge-storage device and the voltage caused by the charging of the charge-storage component is measured by read logic outside the package as a measure of the resistance of the first solder-joint network.

12. The method of claim 1, wherein the digital electronic package is an FPGA or a microcontroller in a Ball Grid Array package.

13. A method of testing the integrity of a first solder-joint network including at least one solder-joint connection and at least one in-series I/O buffer on a die in a digital electronic package, comprising:
   applying power to the digital electronic package;
   using write logic on the die to apply a time-varying voltage to and through the powered-on output buffer and through said at least one solder-joint connection to charge a charge-storage component; and
   using read logic on the die to measure a voltage caused by the charging of the charge-storage component through a second solder-joint network including a second solder-joint connection and an input buffer as a measure of the resistance of the first solder-joint network.

14. The method of claim 13, wherein said first solder-joint network includes at least one said solder-joint connection between said output buffer and said die and at least one said solder-joint connection between the die and the package.

15. The method of claim 14, wherein said first solder-joint network further includes at least one said solder-joint connection between said package and a printed wire board.

16. The method of claim 13, wherein the write logic applies the time-varying voltage as a binary pulse and the read logic measures the voltage as a binary voltage.

17. A method of providing testing the integrity of solder-joint networks, characterized by:
   providing a digital electronic package configured to form an array of external solder-joints and a die mounted therein, said die including an array of operational buffer circuits connected through I/O contacts to respective external solder-joints that form said operational solder-joint networks, an operational buffer circuit being designated as a monitored circuit in which the monitored solder-joint network includes at least one external solder joint connection and at least one in-series I/O buffer on the die;
   applying power to the digital electronic package;
   terminating the monitored solder-joint network with a charge-storage component;
   applying a time-varying voltage to and through the monitored solder-joint network to charge the charge-storage component; and
   measuring a voltage caused by the charge stored on the charge-storage component as a measure of the resistance of the monitor solder-joint network and an indicator of the integrity of the operational solder-joint networks.

* * * * *